US012621001B2

(12) United States Patent
Tung

(10) Patent No.: US 12,621,001 B2
(45) Date of Patent: May 5, 2026

(54) METHOD AND APPARATUS FOR SAR ANALOG-TO-DIGITAL CONVERSION

(71) Applicant: Diodes Incorporated, Plano, TX (US)

(72) Inventor: Yen-Chang Tung, HsinChu (TW)

(73) Assignee: Diodes Incorporated, Plano, TX (US)

( * ) Notice: Subject to any disclaimer, the term of this patent is extended or adjusted under 35 U.S.C. 154(b) by 143 days.

(21) Appl. No.: 18/669,304

(22) Filed: May 20, 2024

(65) Prior Publication Data

US 2025/0357944 A1     Nov. 20, 2025

(51) Int. Cl.
| | |
|---|---|
| *H03M 1/46* | (2006.01) |
| *H03M 1/00* | (2006.01) |
| *H03M 1/06* | (2006.01) |
| *H03M 1/14* | (2006.01) |
| *H03M 1/38* | (2006.01) |
| *H03M 1/50* | (2006.01) |

(52) U.S. Cl.
CPC ........... *H03M 1/462* (2013.01); *H03M 1/002* (2013.01); *H03M 1/0658* (2013.01); *H03M 1/14* (2013.01); *H03M 1/38* (2013.01); *H03M 1/468* (2013.01); *H03M 1/504* (2013.01)

(58) Field of Classification Search
CPC ...... H03M 1/462; H03M 1/504; H03M 1/468; H03M 1/0658; H03M 1/38; H03M 1/002; H03M 1/14
USPC ......................................... 341/155, 161, 172
See application file for complete search history.

(56) References Cited

U.S. PATENT DOCUMENTS

| | | | | |
|---|---|---|---|---|
| 9,912,346 | B1 * | 3/2018 | Hamilton | H03M 1/182 |
| 9,923,569 | B1 * | 3/2018 | Chen | H03M 1/002 |
| 10,404,264 | B2 * | 9/2019 | Chen | H03M 1/468 |

FOREIGN PATENT DOCUMENTS

| | | |
|---|---|---|
| CN | 110380730 B | 2/2023 |

OTHER PUBLICATIONS

Office Action and Search Report for Taiwan Patent Application No. 114104476, mailed Sep. 9, 2025, 6 pages.
Office Action for Korean Patent Application No. 10-2025-7007160, mailed Aug. 27, 2025, 8 pages.
Yim S., et al., Power Efficient SAR ADC Adaptive to Input Activity for ECG Monitoring Applications (IEEE International Symposium on Circuits and Systems, 2017, 4 pages.
Office Action received in Taiwanese Application No. 114104476, dated Dec. 19, 2025, 7 pages.

* cited by examiner

*Primary Examiner* — Khai M Nguyen
(74) *Attorney, Agent, or Firm* — AP3 Law Firm PLLC

(57)     ABSTRACT
A successive approximation register (SAR) analog-to-digital converter (ADC) may be used to generate a first digital data of N-bit and a second digital data of N-bit for an analog data. When the second digital data and the first digital data include a first sequence of most significant bits (MSBs) having same values, a third digital data of N-bit may be generated for the analog data using the SAR ADC in a partial mode. In the partial mode, the SAR ADC is configured to skip determining a second sequence of MSBs of the third digital data, and only determine remaining bits of the third digital data. When the second digital data and the first digital data do not include the first sequence of MSBs having same values, the SAR ADC operates in a full mode to determine every bit of the N-bit third digital data.

20 Claims, 9 Drawing Sheets

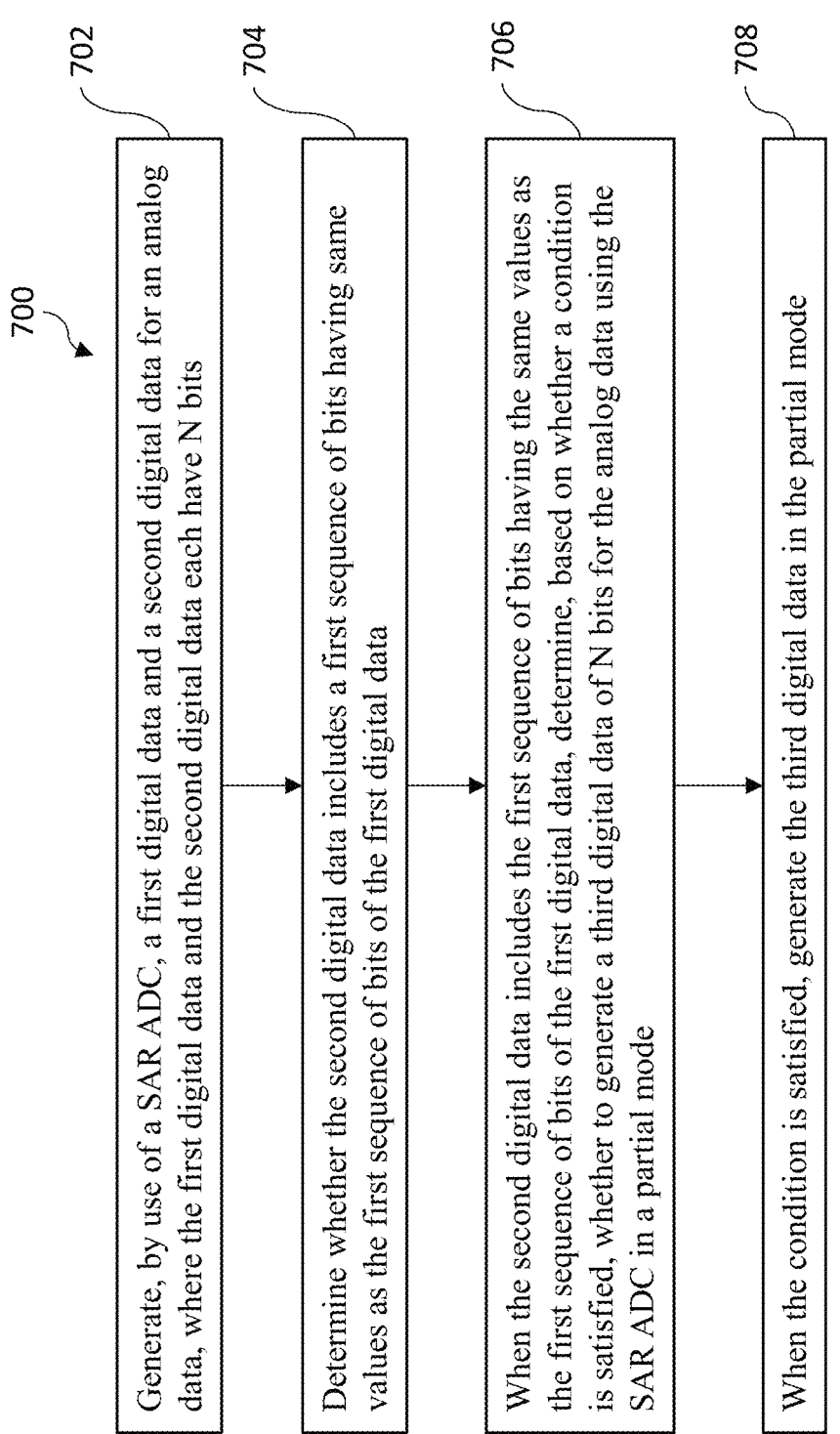

700

702 Generate, by use of a SAR ADC, a first digital data and a second digital data for an analog data, where the first digital data and the second digital data each have N bits 704 Determine whether the second digital data includes a first sequence of bits having same values as the first sequence of bits of the first digital data 706 When the second digital data includes the first sequence of bits having the same values as the first sequence of bits of the first digital data, determine, based on whether a condition is satisfied, whether to generate a third digital data of N bits for the analog data using the SAR ADC in a partial mode 708 When the condition is satisfied, generate the third digital data in the partial mode

FIG. 7

METHOD AND APPARATUS FOR SAR ANALOG-TO-DIGITAL CONVERSION

TECHNICAL FIELD

The present disclosure relates generally to the field of analog-to-digital conversion, and in particular embodiments, to a method and apparatus for successive approximation register (SAR) analog-to-digital conversion.

BACKGROUND

Analog-to-digital converters (ADCs) are commonly used in digital electronics systems to convert analog signals into digital signals. The digital signals may further be processed by various digital processors such as digital audio processors, digital video processors, wireless communication processors, and the like.

In some applications, ADCs may be implemented as standalone semiconductor devices, and in some other applications, ADCs may be integrated with other circuitry on a single integrated circuit. While various analog-to-digital architectures may be used, successive approximation register (SAR) ADCs are widely used in a variety of applications, such as battery-powered instruments, pen digitizers, industrial controls, multiplexed data acquisition, and so on. A SAR ADC performs a successive approximation algorithm (or sometimes referred to as "a binary search algorithm") to output a digital signal. The SAR architecture provides moderate sample rates, medium resolutions, and high-performance with low-power consumption.

SUMMARY

Technical advantages are generally achieved, by embodiments of this disclosure which describe a method and apparatus for successive approximation register analog-to-digital conversion.

In accordance with one aspect of the present disclosure, a method is provided that includes: generating, by use of a successive approximation register (SAR) analog-to-digital converter (ADC), a first digital data of N-bit and a second digital data of N-bit for an analog voltage, wherein N is an integer greater than 1; and when determining that the second digital data and the first digital data include a first sequence of most significant bits (MSBs) having same values, generating a third digital data of N-bit for the analog data using the SAR ADC in a partial mode, in which the SAR ADC is configured to skip determining value(s) of a second sequence of MSBs of the third digital data.

In accordance with another aspect of the present disclosure, a method is provided that includes: generating, by use of a successive approximation register (SAR) analog-to-digital converter (ADC), a first digital data and a second digital data for an analog data, the first digital data and the second digital data each having N bits; determining whether the second digital data includes a first sequence of bits having same values as the first sequence of bits of the first digital data, the first sequence of bits starting from a first most significant bit (MSB); when the second digital data includes the first sequence of bits having the same values as the first sequence of bits of the first digital data, determining, based on whether a condition is satisfied, whether to generate a third digital data of N bits for the analog data using the SAR ADC in a partial mode; and when the condition is satisfied, generating the third digital data in the partial mode, the generating comprising: setting value(s) of a second sequence of bits of the third digital data with respective value(s) of the second sequence of bit of the second digital data, the second sequence of bits starting from the first MSB, and the second sequence of bits comprising less than N bits; and determining values of remaining bits of the third digital data using the SAR ADC.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 7 is a flowchart of yet another example method for SAR A/D conversion according to embodiments of the present disclosure;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Further, one or more features from one or more of the following described embodiments may be combined to create alternative embodiments not explicitly described, and features suitable for such combinations are understood within the scope of this disclosure. It is therefore intended that the appended claims encompass any such modifications or embodiments.

Successive approximation register (SAR) analog-to-digital converters (ADCs) are widely used in a variety of applications requiring medium conversion speeds and resolutions, e.g., monitoring environment, data acquisition, or an application involving a lower frequency than the conversion frequency. A SAR ADC requires less power for green power applications.

Figure 1:
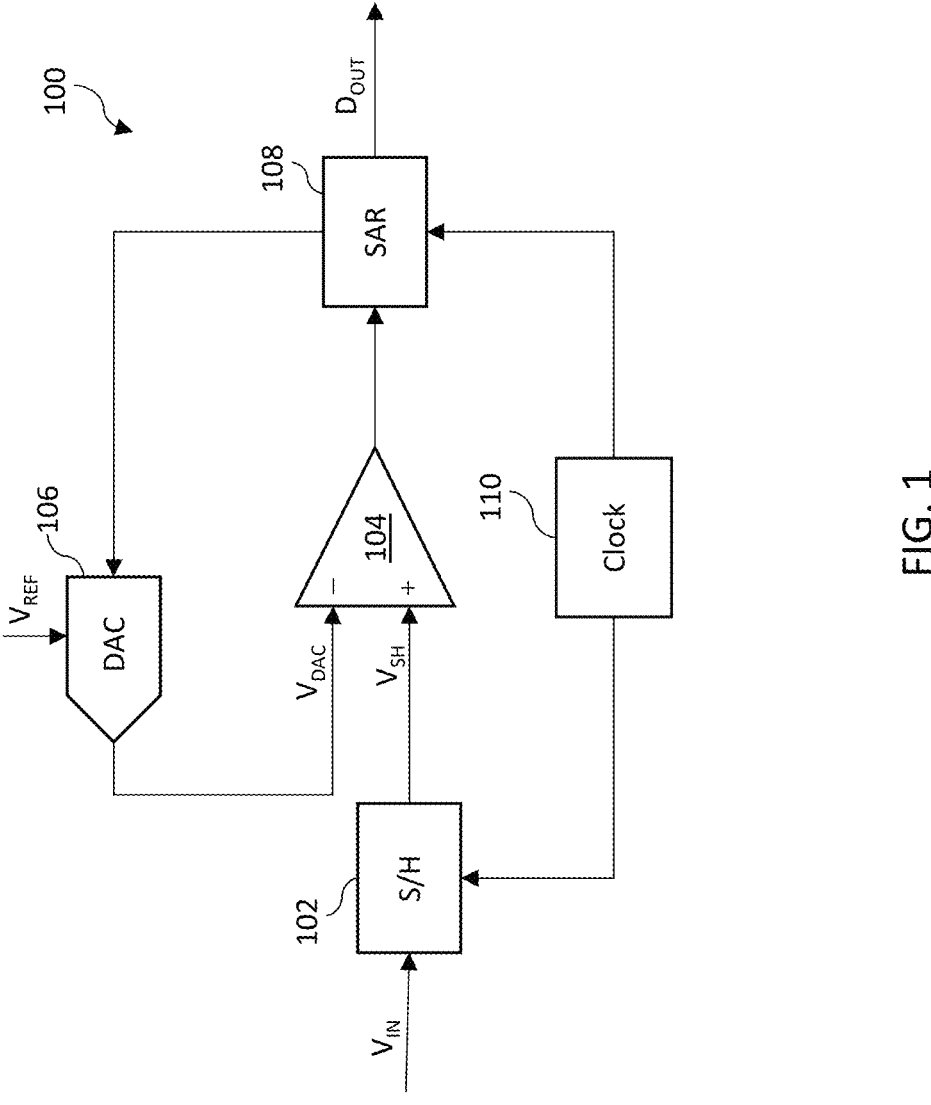
FIG. 1 is a schematic block diagram of an example successive approximation register (SAR) analog-to-digital converter (ADC) according to a conventional technology.

FIG. 1 is a schematic block diagram of a conventional SAR ADC 100. The SAR ADC 100 is configured to sample and convert an analog signal into a digital signal, with each sampled value of the analog signal converted to a digital value of N bits. Specifically, the SAR ADC 100 is configured to sample an input analog voltage (or value, or data) $V_{IN}$ of the analog signal, and convert it into a N-bit digital signal/data/value $D_{OUT}$. The SAR ADC 100 may be referred to as a N-bit SAR ADC, and has a resolution of N bits. N is an integer greater than 1. For example, N may be 4, 8, 12, etc.

In the example as shown, the SAR ADC 100 includes a sample and hold (S/H) circuit 102, a comparator 104, a digital-to-analog converter (DAC) 106, a SAR block/circuit 108, and a clock block/circuit 110. The operation of the SAR ADC 100 may generally include a sampling phase and a conversion phase. In the sampling phase, the SAR ADC 100 samples the analog voltage $V_{IN}$ to obtain and hold a sampled analog value. In the conversion phase, the SAR ADC 100 converts the sampled analog value into an N-bit digital value.

Specifically, the S/H circuit 102 is configured to sample the analog voltage $V_{IN}$ to obtain a sampled analog value $V_{SH}$, and store the sampled value $V_{SH}$ for the conversion phase. The terms of "sampled analog value" and "sampled value" are used herein interchangeably. The S/H circuit 102 is coupled to the comparator 104 and output the sampled value $V_{SH}$ to the comparator 104.

The comparator 104 is an analog comparator and is configured to compare the output of the S/H circuit 102, i.e., the sampled value $V_{SH}$, with an analog threshold $V_{DAC}$ generated by the DAC 106 based on a reference voltage $V_{REF}$. The output of the comparator 104 may be 1 or 0 depending on the comparison of the comparator 104. The output of the comparator 104 is passed to the SAR block 108 as a value of the present bit being converted, and registered and processed by the SAR block 108. The SAR block 108 controls values of the threshold $V_{DAC}$ that the DAC 106 generates, and outputs converted digital values of the sampled analog values of the input analog signal $V_{IN}$. The output of the SAR block 108 is the N-bit digital signal $D_{OUT}$ of the input analog voltage $V_{IN}$. The clock block 110 provides clock signals for the operations of the S/H circuit 102 and the SAR block 108. The threshold $V_{DAC}$ used for determining a bit (that is presently being converted) is determined based on the reference voltage $V_{REF}$ and the previously determined bit(s).

The N bits of a digital value converted for the sampled value $V_{SH}$ are determined one by one in an order from the most significant bit (MSB) to the least significant bit (LSB) through a binary search process, e.g., from bit N to bit 1 (which may also be referred to as: from bit (N−1) to bit 0, from the Nth bit to the 1$^{st}$ bit, from the (N−1)th bit to the 0$^{th}$ bit, based on various naming rules). A SAR ADC generally needs one clock cycle to sample the input analog voltage to obtain one sampled value, and one clock cycle to determine each bit of its digital output corresponding to the sampled value. Therefore, an N-bit SAR ADC generally needs (N+1) clock cycles to digitize the sampled analog value into an N-bit digital value. Thus, the conversion time of the N-bit SAR ADC is (N+1) clock cycles for one sampled value. The conversion rate is thus f/(N+1), where f is the clock signal frequency. The clock cycle may also be referred to as a conversion cycle, during which, one bit of the N-bit digital value is determined.

Figure 2:
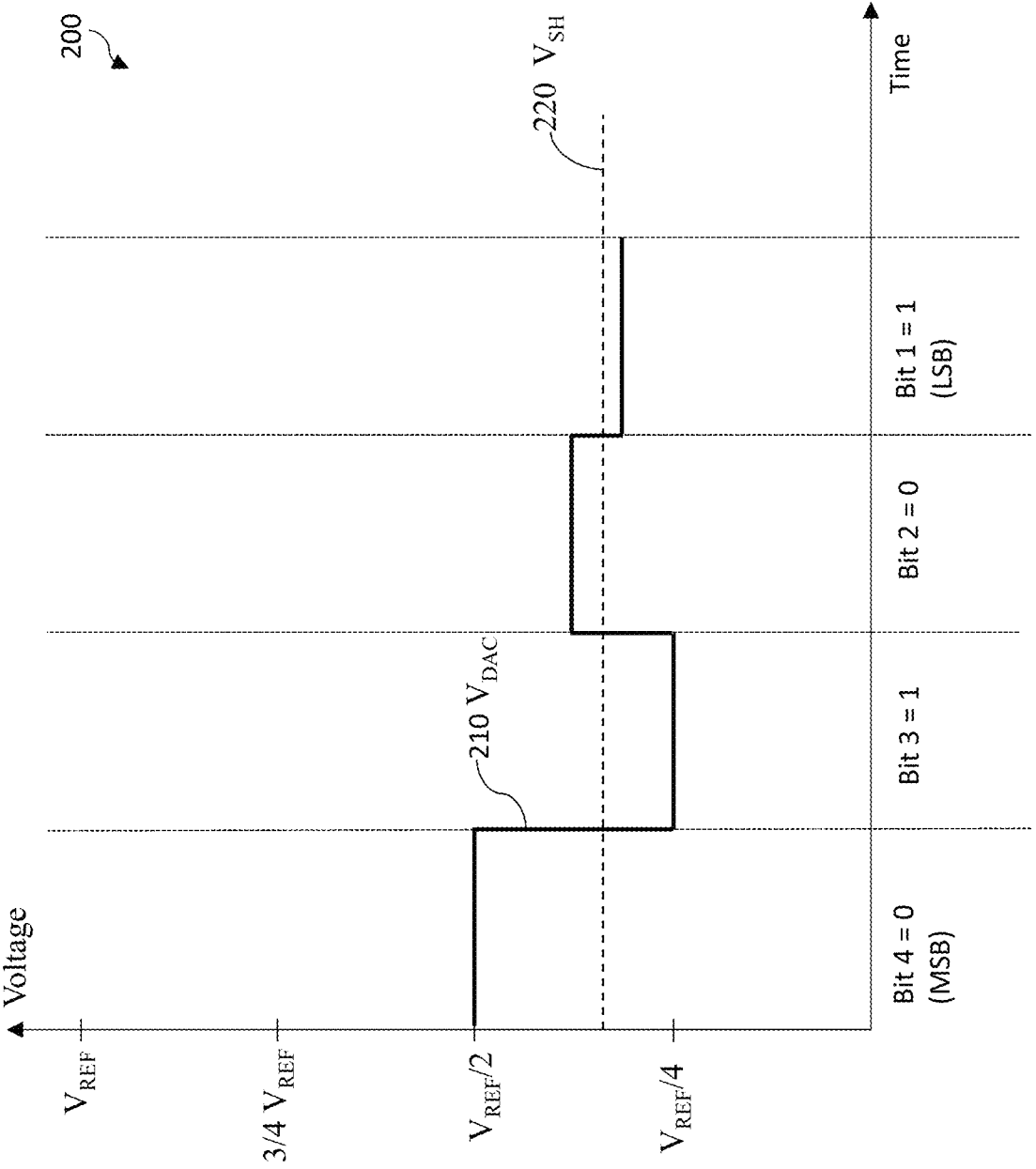
FIG. 2 is a diagram of waveforms showing an operation of the SAR ADC in FIG. 1.

FIG. 2 is a diagram 200 showing an example conversion operation of the SAR ADC 100 with N=4. The horizontal axis represents time, and, the vertical axis represents voltage. Waveform 210 shows the threshold $V_{DAC}$ determined for each bit. Line 220 (dashed line) shows a sampled analog value $V_{SH}$ ($V_{IN}$). Four (4) clock cycles are used to determine the 4 bits of the digital value to be converted for the sampled analog value $V_{SH}$. The binary search algorithm starts with determining the MSB (or the first MSB of the 4 bits) for the sampled value $V_{SH}$, i.e., bit 4. To determine the first MSB, the SAR ADC 100 generates a threshold value $V_{DAC}$ equal to half of a full-scale value (the reference signal $V_{REF}$), i.e., $V_{DAC}=(V_{REF}/2)$, and compares the sampled value $V_{SH}$ to the threshold value $V_{DAC}$. Depending on the result of this comparison, the MSB (bit 4) is determined. For example, when $V_{SH} < V_{DAC}$, the MSB is 0, and when $V_{SH} \geq V_{DAC}$, the MSB is 1. In this example, $V_{SH} < V_{DAC}$, i.e., $V_{SH} < (V_{REF}/2)$, thus bit 4=0.

To determine the next significant bit (second MSB), i.e., bit 3, the SAR ADC 100 generates, based on the previous comparison result for bit 4, another threshold value $V_{DAC}=(V_{REF}/4)$, because the previous comparison reveals that the sampled value is between 0 and ($V_{REF}/2$). The SAR ADC 100 then compares the sampled value $V_{SH}$ to this threshold value $V_{DAC}=(V_{REF}/4)$. Since $V_{SH} > V_{DAC}$, i.e., $V_{SH} > (V_{REF}/4)$, bit 3=1.

For the next significant bit, i.e., bit 2, the SAR ADC 100 generates another threshold value based on the previous comparison for bit 3 similarly. In this case, because the previous comparison reveals that the sampled value is between ($V_{REF}/4$) and ($V_{REF}/2$), the threshold is set to be $V_{DAC}=(3/8V_{REF})$. Because $V_{SH} < V_{DAC}$, i.e., $V_{SH} < (3/8V_{REF})$, bit 2=0. This procedure continues until all the 4 bits of the digital output are determined. For bit 1, $V_{DAC}=(5/16V_{REF})$ and bit 1=1. The output digital value is thus 0101. The waveform 210 shows the different threshold values used for determining the four bits.

Figure 3:
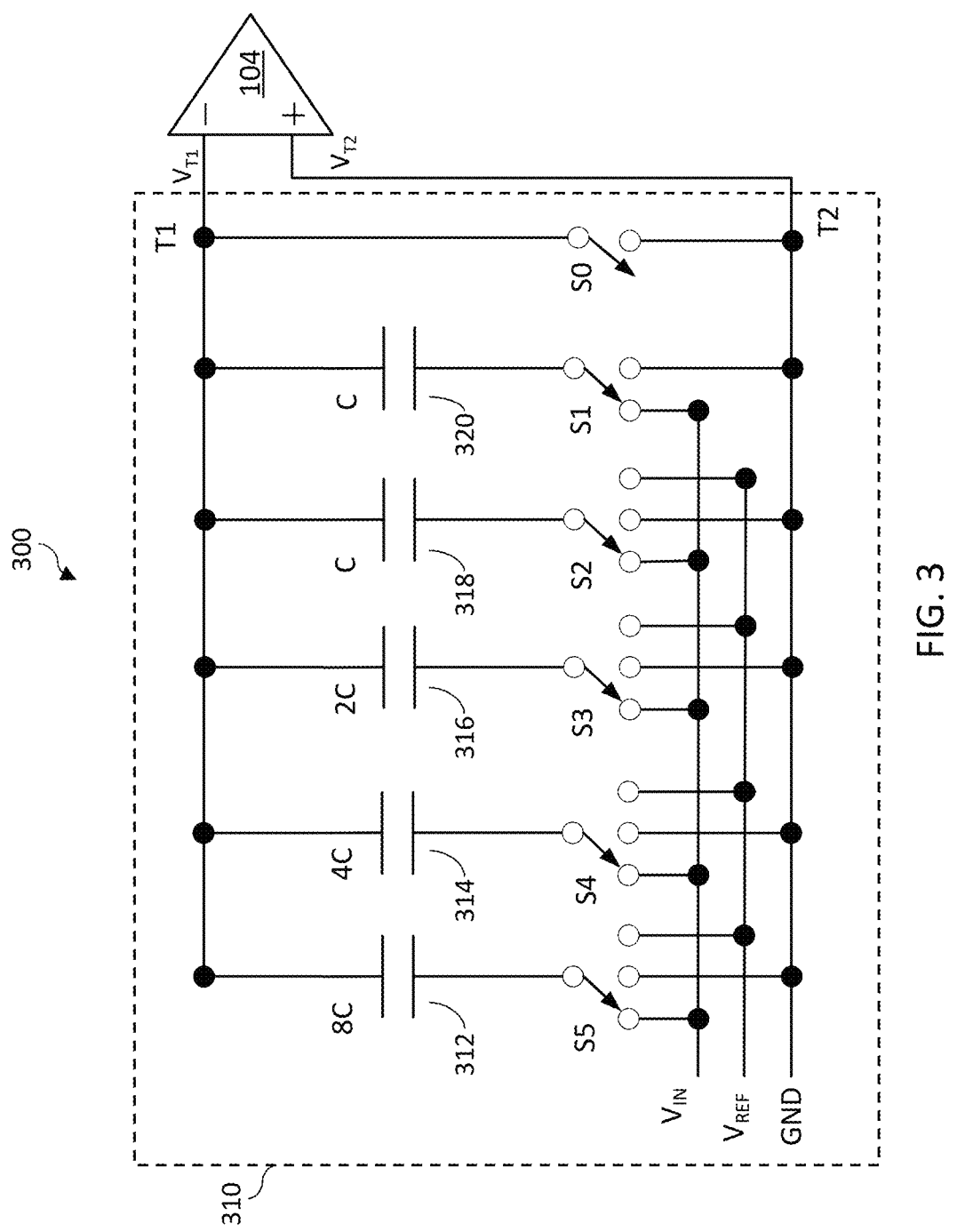
FIG. 3 is a schematic block diagram of an example capacitive DAC that may be used in the SAR ADC of FIG. 1.

The S/H circuit 102 and the DAC 106 of the SAR ADC 100 may be implemented using an array of binary-weighted capacitors, which may be called a capacitive DAC. For an N-bit SAR ADC, a capacitive DAC may include an array of N capacitors with binary weighted capacitance values plus one "dummy LSB" capacitor. FIG. 3 is a diagram of an example circuit 300 for such implementation for the 4-bit SAR ADC as described in FIG. 2. As shown, the circuit 300 includes a 4-bit capacitive DAC 310 connected to the comparator 104. The capacitive DAC 310 includes 4 capacitors 312, 314, 316 and 318, having binary weighted capacitance values respectively, i.e., 8C, 4C, 2C, C, and a dummy LSB capacitor 320 having capacitance C. These capacitors are connected in parallel so that the total capacitance of the 5 capacitors 312-320 is equal to 16C. Each of the capacitors has a respective first terminal connected to a first terminal (e.g., negative terminal) of the comparator 104, and a respective second terminal that may be coupled to the analog input voltage $V_{IN}$, the threshold signal $V_{DAC}$ or the ground through a switch, e.g., single pole triple throw switches S1-S5. The first terminals of the capacitors 312-320 may be collectively referred to as a common terminal T1 of the capacitors (which is also the first terminal of the comparator 104). A second terminal (positive terminal) T2 of the comparator 104 is coupled to the ground. That is, $V_{T2}=0$. The capacitors 312, 314, 316, 318 may be referred to as corresponding to bit 4 to bit 1 of the output digital value, respectively. A switch S0 is connected between terminals T1 and T2. The switch S0 is used to control switching between the sampling phase and the conversion phase.

During the sampling phase, the switch S0 is closed, the common terminal T1 of the capacitors is connected to the ground, and the second terminals of the capacitors 312-318 are connected to the analog input voltage ($V_{IN}$). Hence, the analog input voltage is sampled onto the capacitors 312-318 in the capacitor array, e.g., a charge $V_{SH}$ is stored in the capacitor array.

During the conversion phase, S0 is open, i.e., the common terminal T1 is disconnected from the ground, and the second terminals of the capacitors 312-318 are disconnected from $V_{IN}$. Connecting the lower plate of the capacitors 312-318 to either $V_{DAC}$ or ground can cause charge redistribution among the capacitors. This charge redistribution will change the voltage that appears at the common terminal T1, i.e., the comparator input at the negative terminal of the comparator 104.

During the conversion phase, to perform the binary search algorithm, the capacitors 312-318 are first connected to the ground. In this case, a voltage equal to $-V_{SH}$ will appear at the common terminal T1, i.e., $V_{T1}=-V_{SH}$. In a first clock cycle for determining the first MSB (i.e., bit 4 in this example), the bottom plate of the capacitor 312 (8C) (also referred to as the first MSB capacitor) is disconnected from the ground and connected to $V_{REF}$. This causes the voltage at the common terminal T1 to become $V_{T1}=-V_{SH}+V_{REF}/2$. That is, $V_{DAC}=V_{REF}/2$.

The comparator 104 compares $V_{T1}$ to $V_{T2}$ (i.e., 0v), which is equivalent to comparing the sampled value $V_{SH}$ to the threshold $V_{REF}/2$ (see FIG. 2 as an example). The result of this comparison determines the first MSB value. The result also determines whether the first MSB capacitor 312 should be connected to $V_{REF}$ (when bit 4=1) or the ground (when bit 4=0) for the rest of the conversion phase for determining the remaining bits. If $V_{T1}<0$ (i.e, $V_{SH}>V_{REF}/2$), the comparator 104 outputs a logic 1, i.e., bit 4=1. If $V_{T1}>0$ (i.e, $V_{SH}<V_{REF}/2$), the comparator 104 outputs a logic 0, i.e., bit 4=0. If the comparator 104 outputs logic 1, the bottom plate of the first MSB capacitor 312 stays connected to $V_{REF}$ during determination of the rest significant bits. If the comparator 104 outputs logic 0, the bottom plate of the first MSB capacitor 312 is connected back to the ground during determination of the rest significant bits. Taking the example as illustrated with respect to FIG. 2, bit 4=−0, and thus the second terminal of the capacitor 312 is connected to the ground for the rest of the conversion phase for determining bit 3 to bit 1.

In the second clock cycle to determine the second MSB, i.e., bit 3, the corresponding capacitor, i.e., the capacitor 314, is connected to $V_{REF}$, which is equivalent to setting $V_{DAC}$ to be $V_{REF}/4$ in the second clock cycle. This will increase the voltage $V_{T1}$ at the common terminal by $V_{REF}/4$, i.e., $V_{T1}=-V_{SH}+\frac{1}{4}\times V_{REF}$. The comparator 104 compares $V_{T1}$ to zero (0) (or $V_{T2}$) to determine the value of the bit 3. Based on the comparison result, it is also determined whether the capacitor 314 will be connected to $V_{REF}$ or the ground for the rest of the conversion phase. This procedure will continue until all the bits of the digital value are determined. Taking the example as illustrated with respect to FIG. 2, bit 4=0 is first determined in the first clock cycle, and thus the capacitor 312 is connected to the ground for the rest of the conversion phase. Then bit 3=1 is determined in the second clock cycle, and the capacitor 314 is connected to $V_{REF}$ for the rest of the conversion phase. In the third clock cycle, bit 2=0 is determined, and the capacitor 316 is connected to the ground for the rest of the conversion phase. In the fourth clock cycle, bit 1=1 is determined.

Generally, the above described process for digitizing a sampled analog value may be performed multiple times to obtain multiple N-bit digital values for the input analog voltage, which are then processed to obtain a final N-bit digital value for the analog voltage. For example, an average of the multiple digital values may be used as the final digital value converted for the input analog voltage.

Figure 4:
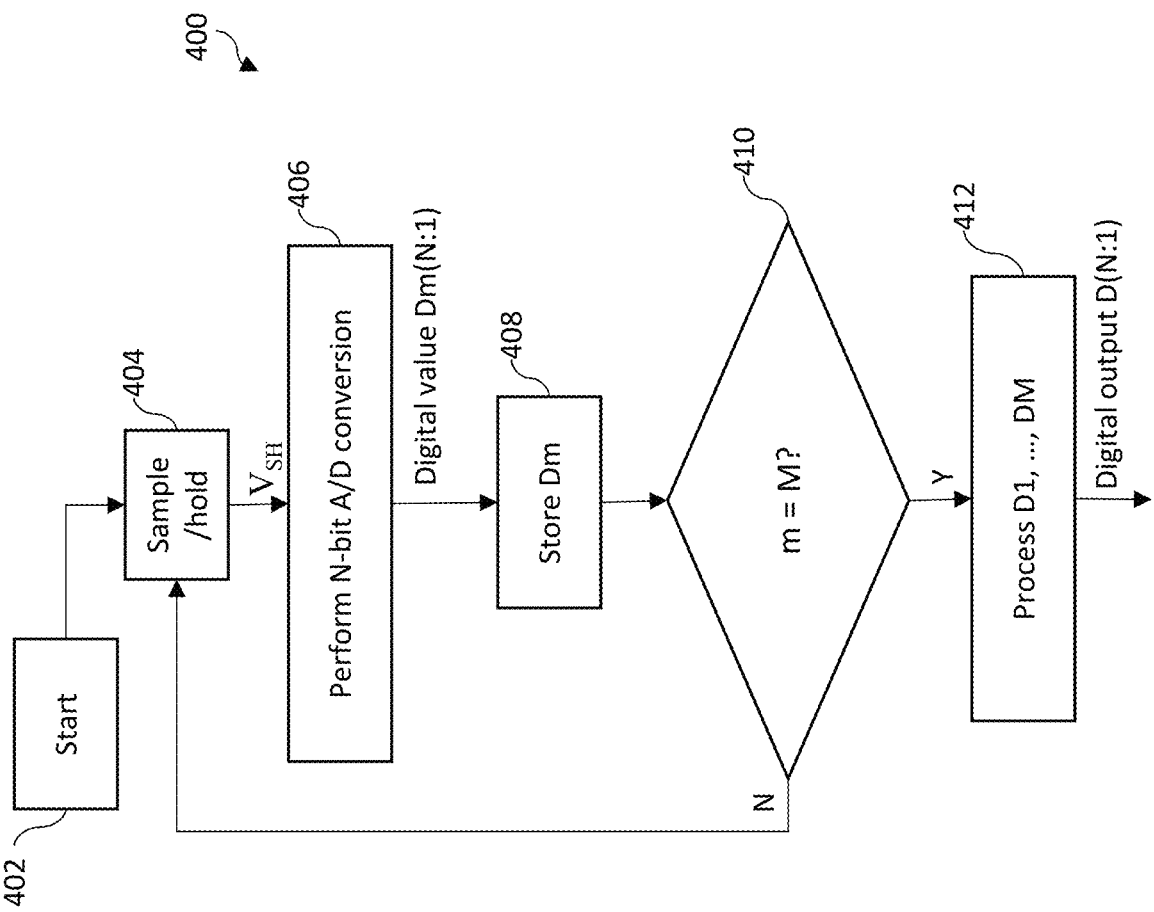
FIG. 4 is a flowchart of an example method for SAR analog-to-digital (A/D) conversion using a SAR ADC.

FIG. 4 is a flowchart of an example method 400 for SAR analog-to-digital (A/D) conversion using a SAR ADC, e.g., the SAR ADC 100. In this example, the SAR ADC may be pre-configured to obtain M digital values of an input analog voltage by performing M times A/D conversions, where M is a positive integer greater than 1. Each of the M times A/D conversions may be referred to as an ADC cycle in the present disclosure. As shown, the method 400 may start from block 402, where the SAR A/D conversion may be started or set to perform A/D conversion for an input analog voltage. The SAR ADC may sample the input analog voltage to obtain and hold a sampled value $V_{SH}$ (block 404). The SAR ADC may then perform N-bit A/D conversion for the sampled value $V_{SH}$ and obtain a digital value Dm(N:1) (block 406), where m is an integer and m=1, 2, . . . , M. (N:1) denotes that the digital value Dm has N bits, with bit N being the MSB and bit 1 being the LSB. The SAR ADC may then store the obtained digital value Dm(N:1) (block 408), and determine whether the M digital values have been generated or M conversions have been completed (block 410). For example, if m<M, i.e., the SAR ADC hasn't generated M digital values for the input analog value, the SAR ADC proceeds to block 404 to perform the next N-bit A/D conversion, where the SAR ADC re-samples the input analog voltage and performs A/D conversion to generate another digital value. If m=M, the SAR ADC may process the obtained M digital values D1, D2, . . . , DM to obtain a N-bit digital output D(N:1) (block 412). D(N:1) is the converted digital value of the analog value output by the SAR ADC.

As described above, the N-bit SAR ADC needs one clock cycle for performing the sampling, and N clock cycles for determining the N bits of a digital value in one ADC cycle, i.e., (1+N) clock cycles in one ADC cycle. For generating M digital values of the analog value, the N-bit SAR ADC needs M(1+N) clock cycles. The conversion rate R of the N-bit SAR ADC for converting an analog value into a digital value may be approximately represented as: R=f/(M+M×N), where f is the frequency of the clock signal. Therefore, the conversion rate of the N-bit SAR ADC is low. To improve the conversion rate, to reduce the conversion time (improve the conversion rate), some existing technologies use higher frequencies or use a combination of two types of ADC to perform A/D conversion, e.g., using a combination of flash ADC and SAR ADC, or a combination of sub-range ADC and SAR ADC. One drawback is that they cause higher current consumption and require complicated algorithms.

Embodiments of the present disclosure provide mechanisms/techniques for SAR A/D conversion. The mechanisms improve the conversion rate and lower the current consumption of a SAR ADC while maintaining the required resolution. The mechanisms may be applied when multiple SAR A/D conversions are performed to obtain a digital value/data of an analog value/data/voltage. In some embodiments, the mechanisms may change the SAR ADC operation flow in a later ADC cycle based on measurement of the ADC output data obtained in an earlier ADC cycle, and control the conversion cycles in the conversion phase of the later ADC cycle. Specifically, the mechanisms may control and change the number of comparisons (i.e., the number of clock cycles)

that are needed in the conversion phase of the later ADC cycle in order to obtain a converted digital value. Thus, the number of clock cycles in the conversion phase may be reduced, and consequently, the conversion time is reduced and conversion rate is improved. With the mechanisms, the conversion rate of the SAR ADC may be increased by about 20-30%, as an example, compared with the conventional SAR ADC methods. The mechanisms can provide a higher conversion rate (or conversion frequency), and an increased ADC bandwidth. The mechanisms may be implemented based on the existing SAR ADC architecture, e.g., the circuit in FIG. 1, with addition of some simple and low cost circuits/operations, e.g., a data comparison circuit, and an addition operation.

As used herein for illustration purposes, the N bits of a digital value are denoted as bit N, bit (N−1), bit (N−2), . . . , bit 2, bit 1 in an order from the MSB to the LSB. They may also be denoted as bit (N−1), bit (N−2), . . . , bit 1, bit 0, or in other applicable manners. As used herein for illustration purposes, bit N may also be referred to as the first MSB, bit (N−1) may also be referred to as the second MSB, and so on. Bit 1 may also be referred to as the first LSB, bit 2 may also be referred to as the second LSB, and so on.

In some embodiments, an N-bit SAR ADC may operate in two conversion modes, i.e., a full mode and a partial mode. In the full mode, the N-bit SAR ADC operates similarly to the conventional SAR ADC to determine the N bits of a digital value one by one from the MSB to the LSB, and N clock cycles are used to determine the N bits. In the partial mode, the N-bit SAR ADC only needs to determine a portion (e.g., K bits from bit K to bit 1) of the N bits, where K<N, and the remaining bits, i.e., bit N to bit K+1, are set with values based on the previous conversions in previous ADC cycle(s). The portion is a sequence of bits including consecutive bits starting from bit K to bit 1, i.e., when the portion include K bits, the portion includes bit K, bit K−1, bit K−2, . . . , bit 1. The remaining bits are also a sequence of bits including consecutive bits starting from bit N to bit K+1. In this partial mode, only K clock cycles are used. The partial mode takes less number of clock cycles in the conversion phase than the full mode. K may be referred to as a mode resolution for the partial mode, and K may be pre-configured and may be configurable. The N-bit SAR ADC may switch between the two modes based on determination whether certain pre-configured condition(s) is/are satisfied, as described in the following.

In some embodiments, SAR A/D conversions may be performed in the full mode to obtain one or more digital values for an input analog value, based on which, values of one or more significant bits in the higher positions may be determined and fixed, and the SAR A/D conversion in a later ADC cycle may be performed in the partial mode to determine only the values of the remaining significant bits in the lower positions, thereby reducing the number of conversion cycles needed in the later ADC cycle.

Figure 5:
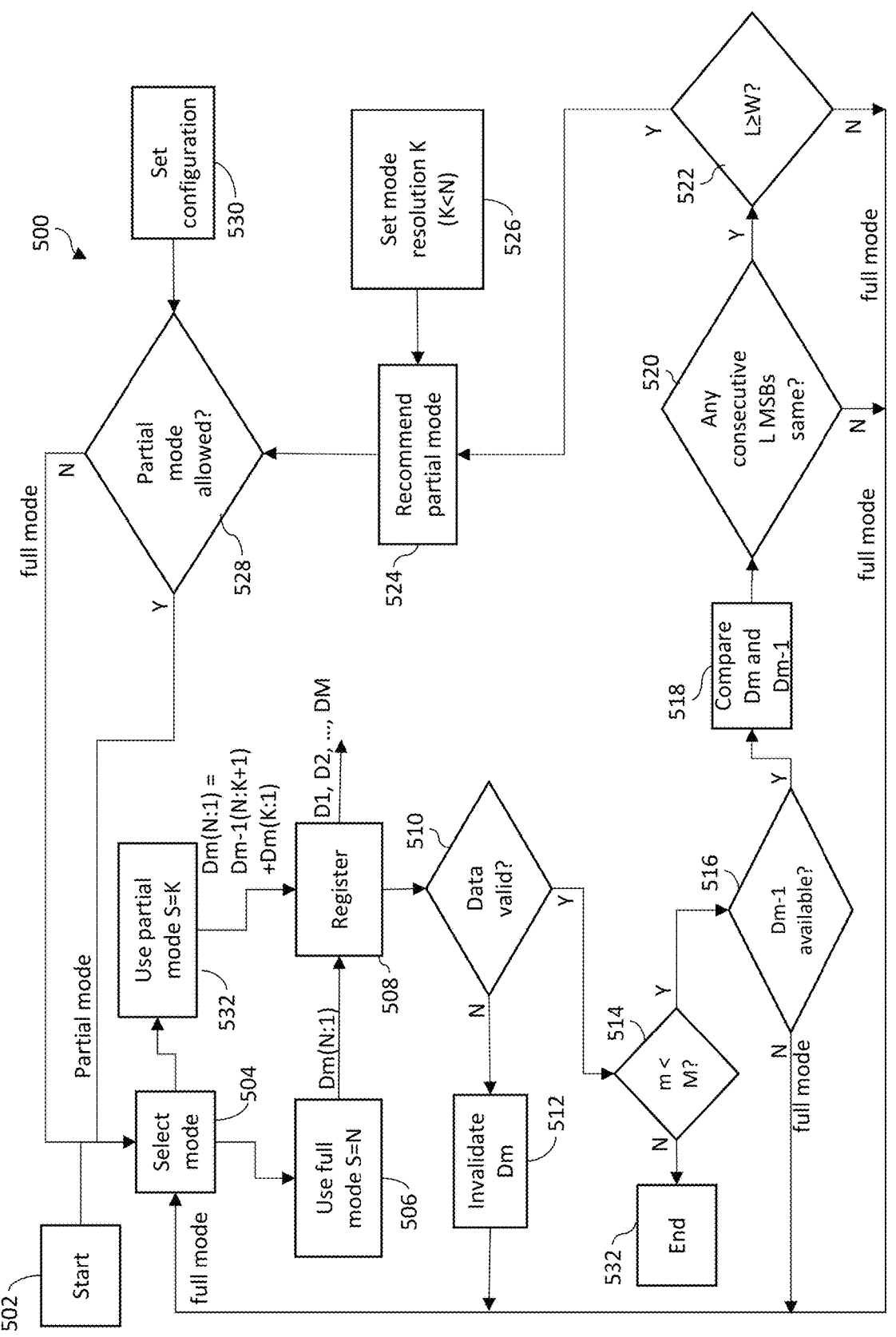
FIG. 5 is a flowchart of an example method for SAR A/D conversion according to embodiments of the present disclosure.

FIG. 5 is a flowchart of an example method 500 for N-bit SAR A/D conversion according to embodiments of the present disclosure. The method 500 may be performed by using a SAR ADC as described in the embodiments of the present disclosure. In the method 500, for an analog value/voltage, M (valid) N-bit digital values D1, D2, . . . , DM may be generated, e.g., by performing M times of (valid) SAR A/D conversions (also referred to as M conversions) in M ADC cycles. In generation of each of the M digital values (i.e., in each of the M SAR A/D conversions), the input analog voltage is sampled to obtain a sampled analog value, and the sampled analog value is converted into a N-bit digital value. For each of the M times of SAR A/D conversions, the full mode or the partial mode may be selected and used to determine the corresponding output digital value. For illustration convenience, the sample/hold block/step is omitted in the following description and related drawings. Sampling/holding may be performed to obtain a sampled analog value each time before the A/D conversion is performed. For example, sampling/holding may be performed before or after the mode for conversion is selected. As used herein, the terms of "digital value" and "digital data" are used interchangeably. M is an integer greater than 1, e.g., M may be 8, 10, 15, and so on. A valid SAR A/D conversion refers to a SAR A/D conversion resulting in a N-bit value that fall within a valid data range. For example, when the N-bit digital value includes N "1s" or "0s", it is not valid. The method 500 may be performed in a case where M valid SAR A/D conversions are required (resulting in M valid digital values), or in a case where M SAR A/D conversions are required (resulting in less than or equal to M valid digital values)

The method 500 starts at block 502, e.g., when the SAR A/D conversion is started. A conversion mode (full or partial) to be used for the SAR A/D conversion of an input analog voltage may be selected (block 504). In an embodiment, for the first conversion or first several conversion of the M conversions to be performed by the SAR ADC (or for generating the first digital value or first several digital values), the full mode may always be selected and performed, i.e., a N-bit SAR ADC conversion is performed. All the N bits of the digital value are determined one by one in N conversion cycles (or clock cycles) for the first conversion. Selecting the full mode for the first conversion (or first several conversions) may generate more accurate digital value(s) as initial estimation. In another embodiment, the partial mode may be selected and performed for the first conversion or first several conversions, where only K consecutive LSBs starting from bit 1 (i.e., bit K, bit K−1, . . . , bit 1) are to be determined. K may be pre-configured. The (N−K) MSBs may be pre-determined or pre-known. In another example, a lower resolution A/D conversion may be performed for the first conversion or first several conversions, e.g., S-bit SAR A/D conversion(s) is/are performed, where S<N. This may be the case when lower resolution is acceptable and shorter conversion time is more critical.

Based on the selected full mode, the N-bit SAR A/D conversion may then be performed (block 506) by use of the SAR ADC, which, for the first conversion, generates an N-bit digital data D1(N:1) (i.e., Dm(N:1) where m=1) of a sampled analog value of the input analog voltage, by determining the N bits one by one as described above. As used herein, Dm(N:1) may also be referred to as Dm. (N:1) denotes that the digital value D1 has N bits, with bit N being the first MSB and bit 1 being the first LSB. S represents the number of bits converted by the SAR ADC, which is also the number of conversion cycles (clock cycles) used to determine the S bits. In this case, S=N. The N-bit digital data D1(N:1) is stored in the register for later processing (block 508).

In some embodiments, validity check may be performed to determine whether the presently generated digital data is valid (block 510), e.g., checking whether the digital data is out of a data range. For example, the presently generated digital data D1(N:1) may be checked to determine whether it has overflow (i.e., it includes all 1s) or underflow (i.e., it includes all 0s). When determining that D1(N:1) is invalid, e.g., it has overflow or underflow, D1(N:1) may be invalidated (block 512), and the method 500 goes back to block

504, where a N-bit SAR A/D conversion in the full mode is performed to re-generate D1(N:1). This may be referred to as "re-generation after invalidation." When the digital data is invalidated, a signal (e.g., a control signal or a mode signal) may be generated indicating whether the full mode or the partial mode may be used for the re-generation after invalidation. In some embodiments, a rule may be configured to specify which mode is used for re-generation after invalidation. As an example, the rule may specify that the same mode may be used for the re-generation after invalidation. As another example, the rule may specify that the full mode may be used for re-generation after invalidation if the partial mode is previously used. Various rules and combinations may be configured. Invalidating the digital data may include deleting the digital data in the register.

When determining that the presently generated digital data is valid, the method 500 may determine whether the M conversions have been completed or whether M digital values have been generated (block 514). The M conversions herein may refer to M valid conversions, where M valid digital values have been generated for the input analog voltage. When there is no invalid digital value generated, the number of conversions performed is equal to the number of generated digital values. Otherwise, when there is/are invalid digital value(s) generated, the number of conversions performed is greater than the number of generated digital values in order to generate the required number of digital values. In an example, a counter with an initial value of zero (0) may be used to count the number of valid conversions performed or the number of valid digital values generated. The counter may be incremented by 1 each time when a valid digital value Dm(N:1) is generated. When m is incremented to be equal to M, the method 500 may end (block 532).

When m<M, i.e., no M valid digital values have been obtained, the method 500 may determine whether a previously generated digital value, i.e., Dm−1(N:1), for the input analog voltage is available (block 516). When the presently generated digital value is D1 (m=1), that is, there is no previously generated digital value available, the method 500 proceeds to block 504, to perform the next N-bit SAR A/D conversion ($2^{nd}$ conversion) in the full mode to generate D2(N:1), which may then be saved in the register. The second digital data D2 may also be generated in the partial mode with a pre-configured resolution less than N.

When the previously generated digital value is available, the method 500 may compare the presently generated digital value Dm(N:1) to the previously generated digital value Dm−1(N:1) (block 518). Based on the comparison result, the method 500 determines whether Dm has one or multiple consecutive significant bits, starting from the first MSB, whose corresponding values are the same as those of Dm−1 (block 520). That is, the method 500 determines whether there is a sequence of bits starting from the first MSB in Dm having the same values as the sequence of bits in Dm−1.

In some embodiments, the bit values of Dm and Dm−1 may be compared starting from bit N. As an example, the values corresponding to the first MSB (i.e., bit N) of Dm and Dm−1 may be compared, and if the values are the same, the values corresponding to the second MSB (bit N−1) of Dm and Dm−1 may be compared. If the values corresponding to the second MSB (i.e., bit N−1) of Dm and Dm−1 are the same, the values corresponding to the third MSB (i.e., bit N−2) of Dm and Dm−1 may be compared. The comparison may be continued and then stop when different values corresponding to a bit position (e.g., bit (N−L)) of Dm and Dm−1 are found. That is, the values corresponding to bit N to bit (N−L+1) of Dm and Dm−1 are the same. In other words, the values of the first L MSBs of Dm and the values of the first L MSBs of Dm−1 are the same. L is an integer and 1≤L≤N. The comparison finds the number L. In the following, a case when "a value of a bit q of Dm is the same as a value of the bit q of Dm−1" may also be referred to as "bit q of Dm and bit q of Dm−1 are the same," or "Dm and Dm−1 have the same bit q."

Table 1 below shows an example of the digital values Dm (m=1, 2, . . . M) that are generated for an input analog voltage, where M=5, and N=12. Table 1 will be used in the following to illustrate the embodiment method 500 as an example. Table 1 also shows the values of L for the generated digital values Dm. As an example, in Table 1, comparing D1 and D2, the first 5 MSBs (L=5), i.e., bit 12 to bit 8, of D1 and D2 are the same: 10110.

TABLE 1

| Number of digital values | Digital values | L |
|---|---|---|
| D1 | 1011 0110 1101 | n/a |
| D2 | 1011 0011 1011 | 5 |
| D3 | 1011 0001 1010 | 6 |
| D4 | 1011 0001 0101 | 8 |
| D5 | 1011 0001 0111 | 10 |

If bit N of Dm and bit N of Dm−1 are not the same, the method 500 proceeds to block 504, selects the full mode and performs the N-bit SAR A/D conversion to generate the next digital value, e.g., D3 (N:1). When no same bits are found in Dm and Dm−1, the full mode may be selected for the next ADC cycle in order to obtain an accurate conversion for subsequent comparison.

When Dm and Dm−1 (e.g., D1 and D2) have the same first L MSBs (i.e., bit N to bit (N-L+1)), the method 500 proceeds to determine whether L is greater than a threshold value W. In some embodiments, the SAR ADC bandwidth may be set to be about four (4) times of the bandwidth of the input analog signal. Thus, the maximum signal drift (error) is about ¼ full scale, and W may be set to N/4. W may be configured based on other considerations and applications.

If L<W, the method 500 goes back to the block 504 to generate the next digital value in the full mode. In this case, one consideration is that, since there are only less than the threshold number W of MSBs that are the same, the full mode is used again in order to generate a more accurate conversion. If L≥W, the method 500 may recommend the partial mode for the next conversion (in the next ADC cycle) (block 524). The mode resolution K for the partial mode may be set (block 526), where K<N. The mode resolution K, i.e., the number of bits to be determined through the SAR A/D conversion (i.e., K LSBs starting from bit 1) may be pre-configured and configurable. In some embodiments, K may be set based on a pre-defined rule, e.g., K may depend on a combination of any two of N, W, and L detected in the present ADC cycle. As an example, K=N−L+1. As another example, K=N−(L−W)+2. As yet another example, K may be a pre-configured constant. As yet another example, starting from bit (N−L+1) to bit N, if bit Q is the first bit found to have a value zero (0), K may be set to Q, i.e., K=Q.

Using the example shown in Table 1, D1 and D2 have the same first 5 MSBs (from bit 12 to bit 8), i.e., 10110, L=5, and W=N/4=3. Thus, since L>W, the method 500 may recommend to perform the next conversion (the $3^{rd}$ conversion) using the partial mode to generate the digital value D3. In an example, K may be set to K=N−L+1=8, Thus, for the $3^{rd}$ conversion, the partial mode may be performed with only K LSBs (i.e., bit 8 to bit 1) of D3 being determined using the SAR ADC. Bit 12 to bit 9 of D3 may be set to have the same values as those bits of D2.

The method 500 may determine whether the partial mode is allowed for the next conversion (block 528). This step may be optional. This may be determined based on a configuration or condition. The configuration may be set based on needs or applications (block 530). The configuration may be pre-set and is configurable. In an embodiment, the configuration may allow the partial mode for the next conversion after the partial mode is recommended. In another embodiment, the configuration may allow the partial mode for the next conversion after the partial mode is recommended for a pre-set number of times. In another embodiment, the configuration may allow the partial mode for the next conversion after the partial mode is recommended and after a pre-set number of valid digital values have been generated. In another embodiment, the configuration may allow the partial mode for the next conversion after the partial mode is recommended and after a pre-set number of full mode conversions have been performed. Other applicable conditions/rules may also be used to set the configuration for specifying whether the partial mode is allowed for the next conversion. In some embodiments, one or more rules, e.g., as previously described, may be combined to set the configuration. Those of ordinary skill in the art would recognize various embodiments, alterations and modification for setting the configuration.

When determining that the partial mode is not allowed for the next conversion, the method 500 goes back to block 504, where the full mode is selected to generate the next digital value D3.

When determining that the partial mode is allowed for the next conversion, the method 500 switches to the partial mode (block 504) and performs a SAR A/D conversion in the partial mode (block 532). Using the Table 1 above as an example, in the partial mode, K=8, the SAR ADC only determines the last 8 bits of D3 (bit 8 to bit 1), and bit 12 to bit 9 of D3 are assigned with values 1011, which are the same as the respective values of bit 12 to bit 9 of D2. That is, the N-bit SAR ADC only performs A/D conversion for the K LSBs, with the (N–K) MSBs set with values the same as those of D2, which may be referred to as a K-bit partial SAR A/D conversion or K-bit partial conversion. In an example implementation (referring back to FIG. 2), for 1011, the corresponding capacitors of bit 12, bit 10 and bit 9 are connected to the reference voltage/bus, and the corresponding capacitor of bit 11 is connected to the ground. Then the SAR ADC performs 8-bit SAR A/D conversion to determine the remaining 8 bits (bit 8 to bit 1) one by one starting from bit 8. Thus, for the $3^{rd}$ conversion, the SAR ADC only needs 8 clock cycles to determine the 8 bits. The resultant N-bit digital value generated in the partial mode is: Dm(N:1)=Dm–1(N:K+1)+Dm(K:1). That is, for Dm(N:1), its bit N~bit (K+1) have the same values as those bits of Dm–1(N:1), and its bit K~bit 1 have values that are determine by the SAR ADC during the present conversion. In the example of Table 1, D3(12:1)=D2(12:9)+D3(8:1). D3 may then be saved in the register (block 508). The method 500 then goes to the block 510 to check whether the generated digital value D3 is valid, and the method 500 proceeds similarly as described previously.

As shown in the example of Table 1, since the first 6 MSBs (bit 12 to bit 7) of D3 are the same as those of D2 (i.e., L=6), the partial mode is recommended for the $4^{th}$ conversion. If the partial mode is allowed, D4 may be generated in the partial mode by performing a K-bit partial conversion, with D4=D3(N:K+1)+D4(K:1). In this case, K=N–L+1=7, and D4 (12:1)=D3(12:8)+D4(7:1). That is, only 7 clock cycles, instead of 12 clock cycles, are used to obtain D4 during the $4^{th}$ conversion.

Similarly, as shown in table 1, the first 8 MSBs of D4 are the same as those of D3 (i.e., L=8), the partial mode is recommended for the $5^{th}$ conversion. If the partial mode is allowed, D5 may be generated in the partial mode by performing a K-bit partial conversion, with D5(12:1)=D4(N:K+1)+D5(K:1). If K=N–L+1=5, D4=D3(12:6)+D4(5:1). That is, only 5 clock cycles are needed/used to obtain D5 during the $5^{th}$ conversion. If only 5 valid digital values (D1-D5) are required for the input analog voltage, the method 500 ends here. The register may output the 5 digital values D1~D5, which may be processed to generate a digital output corresponding to the sampled analog value.

To generate the 5 digital values D1~D5 in the above embodiment method 500, 5 ADC cycles are used, and the total number of clock cycles used is 12+12+8+7+5=44; while using the conventional technology, the total number of clock cycles needed is 12*5=60. By utilizing the previously generated digital values for an analog voltage, the embodiments obtain an estimated range of the analog value, and perform SAR A/D conversion within this range for the next conversion. The embodiments thus reduce the number of bits to be determined in some ADC cycles, and therefore reduce conversion time needed and increase the conversion rate. The embodiments will be more beneficial when the number of conversions (ADC cycles) to be performed is large, and/or when the SAR ADC resolution (N) is large.

In some embodiments, the value of W may be determined by testing different values of W using a set of analog voltages/sampled values. As an example, the embodiment method 500 may be used to convert a set of analog values into digital values using different values of W. Based on the resultant conversion time corresponding the different values of W, and optionally, other factors such as a conversion time restriction, a value of W may be selected. For example, a value of W corresponding to the minimum conversion time used may be selected. Other rules for selecting the value of W may also be applicable, such as a rule considering a tradeoff between the conversion time and conversion accuracy.

In some embodiments, the method 500 may compare, at block 518, Dm with an average Davg of a plurality of previously generated digital values, instead of merely Dm–1. As an example, Davg=average {Dm–1, Dm–2, . . . , D(m–J)}, where J is an integer, and 1≤J≤m–1. Davg may be initialized as void. When Dm is D1 (m=1), Davg is unavailable, and the method 500 goes back to the block 504 to generate D2 in the full mode.

In some embodiments, when the partial mode is selected (e.g., in block 504), a calibration function block/circuit may be provided in order to avoid generating overflow digital values (performing overflow check). One clock cycle may be needed to perform the calibration using the calibration function block, which may decrease the conversion rate, e.g., by one clock cycle. As an example, the calibration function block may include a comparator configured to compare a generated digital value to an overflow reference voltage. When the generated digital value is greater than the overflow reference voltage, the SAR ADC may switch, from the partial mode to the full mode to avoid data loss. When the generated digital value is not greater than the overflow reference voltage, the SAR ADC may continue to operate in the partial mode.

The overflow reference voltage Dr(N:1) for the present conversion in the partial mode may be set based on a digital value Dm(N:1) previously generated by the SAR ADC. In an example, starting from bit L to bit N of Dm, if bit P is the second bit found to have a value zero (0), Dr(N:1) may be set to be Dm(N:1) but with the bit P equal to 1. In another example, Dr(N:1) may be configured such that the values of bit N~bit P of Dr are 1s, and values of bit (P−1)~bit 1 of Dr are 0s.

In some embodiments, the steps from 510 to 528 may be performed by use of a controller, which may be implemented by hardware, software, or a combination thereof. For example, the controller may be a microcontroller unit (MCU) configured to execute a software/firmware. As an example, when Dm is generated during the present conversion, Dm may be sent to the MCU, where validity of Dm is checked, and whether the partial mode is recommended and allowed is determined. The MCU may generate an output, e.g., an instruction/command signal, or a control signal/bit, instructing the SAR ADC to operate in the full mode or the partial mode for the next conversion, or instructing the SAR ADC to re-generate a digital value for the input analog voltage. The SAR ADC may then select the instructed mode, and operate according to the selected mode to generate the digital value.

In some embodiments, the partial mode may be disabled or enabled based on various applications or A/D conversion requirements. Enabling the partial mode may increase the SAR ADC bandwidth. Disabling the partial mode may reduce high frequency noises. In an example, if a longer conversion time is not a concern, the partial mode may be disabled. In this case, step 516 to step 532 may not be performed, and the method 400 may be used. In another example, if an application requires a restricted conversion time, the partial mode may be enabled in order to meet the requirement. The SAR ADC may switch operating between the full mode and full+partial modes depending on the input analog signals. In some embodiments, the number of conversion bits may be fixed when the SAR ADC operates, e.g., when only low resolution conversion is needed, and only several measurements of the direct current (DC) voltage may be needed for easy processing.

In some embodiments, the data validity check function (block 510) of the method 500 may be enabled or disabled, e.g., by use of a control bit/signal. As an example, the control bit may be set indicating whether the data validity check function is enabled between the sampling phase and the conversion phase.

Figure 6:
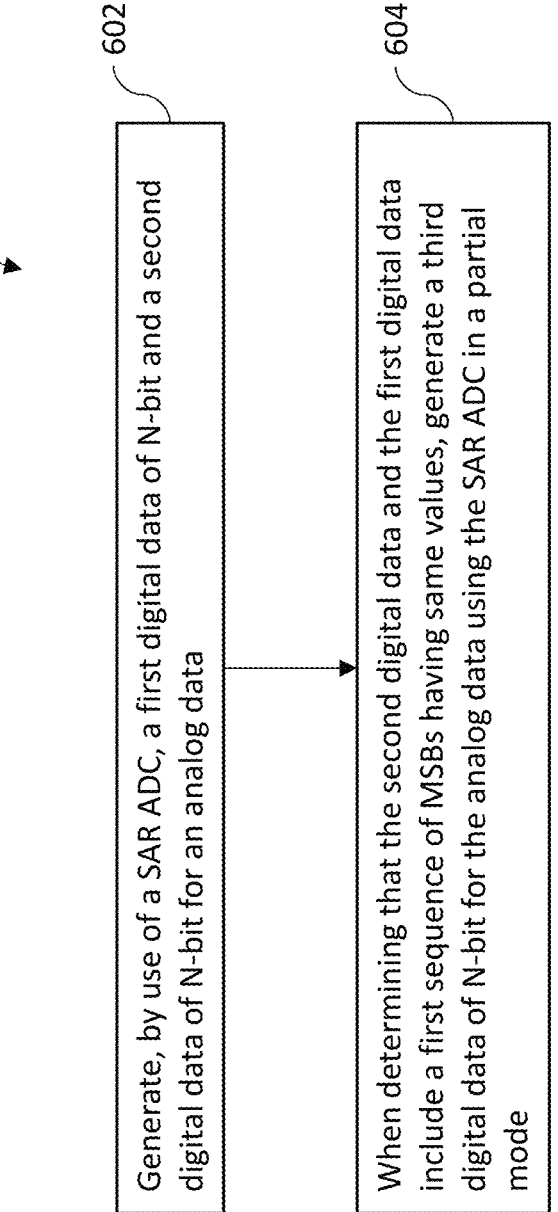
FIG. 6 is a flowchart of another example method for SAR A/D conversion according to embodiments of the present disclosure.

FIG. 6 is a flowchart of another example method 600 for N-bit SAR A/D conversion according to embodiments of the present disclosure. The method 600 may be performed by using a SAR ADC as described in the embodiments of the present disclosure. The method 600 may include generating, by use of the SAR ADC, a first digital data of N-bit and a second digital data of N-bit for an analog data (block 602). The method 600 may further include: when determining that the second digital data and the first digital data include a first sequence of most significant bits (MSBs) having same values, generating a third digital data of N-bit for the analog data using the SAR ADC in a partial mode. In the partial mode, the SAR ADC is configured to skip determining a second sequence of MSBs of the third digital data (block 604).

FIG. 7 is a flowchart of another example method 700 for N-bit SAR A/D conversion according to embodiments of the present disclosure. The method 700 may be performed by using a SAR ADC as described in the embodiments of the present disclosure. The method 700 may include generating, by use of a SAR ADC, a first digital data and a second digital data for an analog data, where the first digital data and the second digital data each have N bits (block 702). The method 700 may further include determining whether the second digital data includes a first sequence of bits having same values as the first sequence of bits of the first digital data (block 704). The method 700 may further include: when the second digital data includes the first sequence of bits having the same values as the first sequence of bits of the first digital data, determining, based on whether a condition is satisfied, whether to generate a third digital data of N bits for the analog data using the SAR ADC in a partial mode (block 706). The method 700 may further include: when the condition is satisfied, generating the third digital data in the partial mode (block 708). As an example, generating the third digital data in the partial mode may include: setting a second sequence of bits of the third digital data with respective values of the second sequence of bits of the second digital data; and determining values of remaining bits of the third digital data using the SAR ADC. The first sequence of bits and the second sequence of bits each start from a first MSB. The second sequence of bits includes less than N bits.

It is noted that the various steps of the embodiment methods in the present disclosure may be changed (e.g., swapped, removed, reordered, enhanced, configured, and so on) in different embodiments without changing the example embodiments presented herein. In different embodiments, some of the steps may be skipped or combined, performed in parallel, or performed in different orders than what is shown in the figures. As an example, the steps 524 and 528 of the method 500 may be combined or skipped. As another example, the step 530 of the method 500 may be removed, where the configuration may be pre-set for the SAR ADC before its operation. As yet another example, the ordering of steps 508 and 510 of the method 500 may be swapped.

Figure 8:
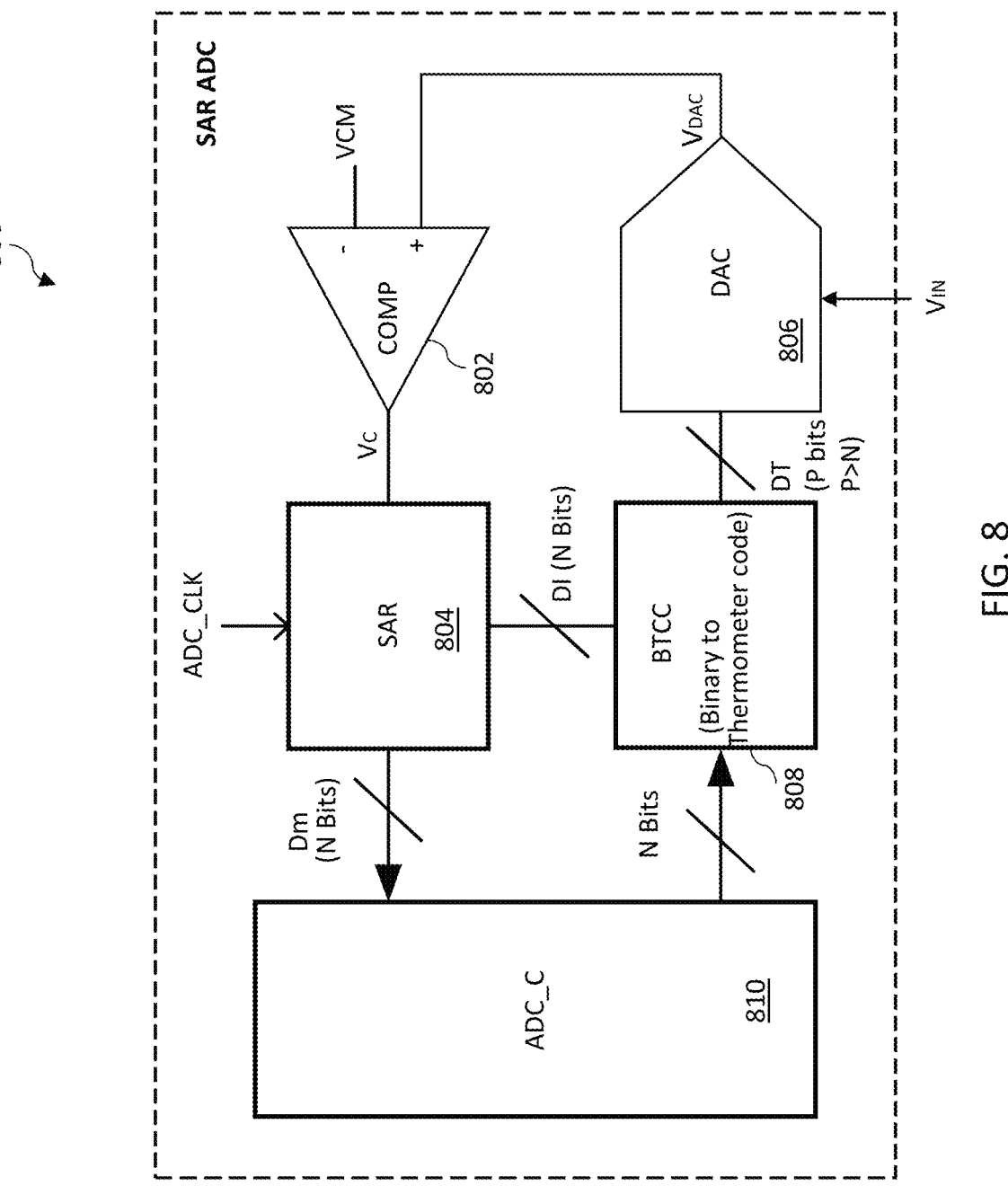
FIG. 8 is a block diagram of an example SAR ADC circuit according to embodiments of the present disclosure.

FIG. 8 is a block diagram of an example circuit 800 of a SAR ADC according to embodiments of the present disclosure. The SAR ADC is configured to generate multiple N-bit digital values/data Dm for an input analog value/data/voltage $V_{EV}$, and implements the embodiment methods described above. The input analog voltage is sampled and hold, and converted into a N-bit digital value $D_m$. The sampling and hold operation is omitted in the following for illustration convenience. The SAR ADC 800 includes a comparator 802, a SAR block/module 804, a DAC 806, a binary to thermometer code converter (BTCC) 808, and an ADC controller (ADC_C) 810.

The comparator 802 includes a first input terminal (negative terminal) connected to a constant voltage VCM, which is set to be $V_{REF}/2$, and a second input terminal (positive terminal) connected to a voltage $V_{DAC}$ output by the DAC 806. The output terminal of the comparator 802 is connected to the SAR block 804. The comparator 802 compares VCM to $V_{DAC}$, and outputs a comparison result $V_C$, which may be a logic 1 or 0. As an example, when VCM>$V_{DAC}$, $V_C$=1; and otherwise, VCM≤$V_{DAC}$, $V_C$=0. $V_C$ is then passed to the SAR block 804. The comparator 802 operates similarly to comparator 104 as described with respect to FIG. 1.

The SAR block 804 is connected to the comparator 802, the BTCC 808 and the ADC_C block 810. The SAR block 804 is similar to the SAR block 108 as described with respect to FIG. 1. The SAR block 804 is configured to determine a present bit of the digital value Dm based on the comparison result $V_C$, and register/store the determined bit. For example, when the comparison result is the logic high, the present bit is determined to be 1, and when the comparison result is the logic low, the present bit is determined to be 0. The SAR block 804 is configured to output, to the ADC_C 810, the digital value Dm generated in the present ADC cycle for the input analog voltage. The SAR block 804 may be configured to operate in the partial mode or the full mode.

The SAR block 804 is also configured to control values of the analog voltage $V_{DAC}$ generated by the DAC 806. In an example operation, after the SAR block 804 determines the present bit of the digital value Dm, the SAR block 804 may output an intermediate N-bit digital value DI to the BTCC 808, where DI includes values of bit(s) of the digital value Dm that have been determined so far in the present ADC cycle. Other bit(s) that has/have not been determined has/have value(s) of 0. The N-bit digital value DI may be referred to as the presently determined digital value of $V_{IN}$. DI is provided for the DAC 806 to determine $V_{DAC}$ for the next clock cycle in determining the value of the next bit of the digital value Dm.

The BTCC 808 is configured to receive the N-bit digital value DI and perform binary to thermometer code conversion to obtain thermometer code DT that is P bits code, where P is an integer generally greater than N. The BTCC 808 increases the number of bits of the presently determined digital value, and improves accuracy to determine $V_{DAC}$. In some embodiments, when the SAR block 804 is operating in the partial mode, DI only includes bit values of those bits determined by the SAR block 804, and one or more MSBs may be assigned with bit value(s) determined in previous ADC cycle(s). In this case, the BTCC 808 may obtain the bit value(s) for the one or more MSBs from the ADC_C block 810. Using Table 1 as an example, the SAR block 804 is operating in the partial mode to determine K=8 bits (bit 8 to bit 1) of D3, the present bit determined is bit 8=0, and thus DI=[0000 0000 0000]. The BTCC may obtain D2 ([1011 0011 1011]) from the ADC_C 810 and set DI to [1011 0000 0000], where bit 12~bit 9 of DI have values of those bits of D2. The BTCC 808 may then convert DI to the P-bit thermometer code DT.

The DAC 806 is configured to receive the P-bit code DT output the BTCC 808, and determine the voltage $V_{DAC}$ based on DT and $V_{IN}$. Table 2 below shows example values of $V_{DAC}$ in i clock cycles for determining bits of a digital value Dm, where i is an integer and is in the range of [1, N]. In this example, each clock cycle is used to determine one bit of the N bits, starting from clock cycle 1 to clock cycle i, for determining from bit N to bit 1. $B_N$, $B_{N-1}$, $B_{N-2}$, . . . , $B_{N-(i-1)}$, represent bit values of bits N, N-1, N-2, . . . , N-(i-1) determined.

TABLE 2

| Clock cycle Number i | Bit determined | $V_{DAC}$ |
|---|---|---|
| 1 | N | VCM-$V_{IN}$ + VCM |
| 2 | N-1 | VCM-$V_{IN}$ + VCM × ($B_N$) + VCM/2 |
| 3 | N-2 | VCM-$V_{IN}$ + VCM × ($B_N$) + VCM/2 × ($B_{N-1}$) + VCM/4 |
| . . . | . . . | |
| i | | VCM-$V_{IN}$ + VCM × ($B_N$) + VCM/2 × ($B_{N-1}$) + VCM/4 × ($B_{N-2}$) + VCM/8 × ($B_{N-3}$) + . . . + VCM/($2^{(i-2)}$) × ($B_{N-(i-1)}$) + VCM/$2^{(i-1)}$ |

The ADC_C block 810 is configured to receive and store digital value(s) Dm (m=1, 2, . . . , M) converted by the SAR block 804, determine whether the full mode or the partial mode is to be utilized for the next ADC cycle, and controls the SAR block 804 to operate in the corresponding mode. The ADC_C block 810 may be configured to output the finalized digital value converted by the SAR ADC for the input analog voltage.

The ADC_C block 810 may determine whether the partial mode may be used in the next ADC cycle by comparing a presently generated Dm to a previously generated Dm−1, as described above with respect to FIG. 5. When a sequence of bits starting from the first MSB in Dm and Dm−1 have the same values, the ADC_C block 810 may determine to use the partial mode in the next ADC cycle to generate the digital value Dm+1, e.g., when a condition/configuration is satisfied as discussed above. In some embodiments, the mode may be determined by comparing a presently generated Dm to an average Davg of multiple previously generated digital values. As an example, Davg may be an average of digital values D1, D2, . . . , Dm−1 that have been previously generated. As another example, Davg may be an average of a pre-determined number J of the most recently generated digital values Dm−1, Dm−2, . . . , Dm−J, where 1≤J≤m−1. When J=1, the comparison is between Dm and Dm−1.

To control the SAR ADC to operate in the determined mode, various methods may be utilized. In an embodiment, the ADC_C block 810 may signal the SAR block to start determining bits of the digital value from the first MSB (bit N) in case of the full mode, or from the K-th MSB (bit K) in case of the partial mode.

Figure 9:
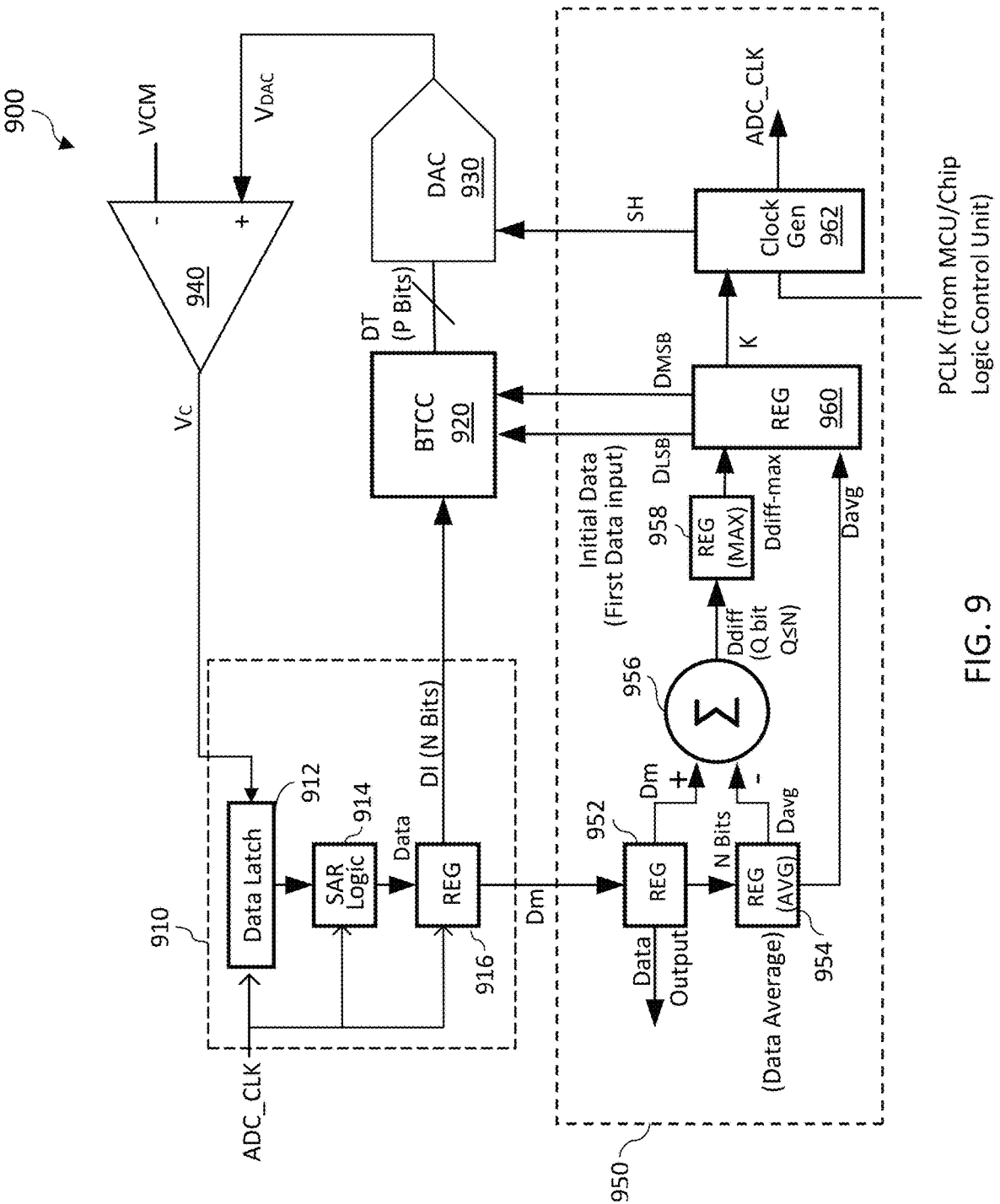
FIG. 9 is a block diagram of another example SAR ADC circuit according to embodiments of the present disclosure.

In another embodiment, the control may be carried out by use of the clock signals. In each ADC cycle and in the conversion phase, to determine the N bits of a digital output value Dm, N clock cycles (N clock signals) are used. In an embodiment, the N clock cycles (clock signals) may be numbered with 1–N. That is, bit N is generated in clock cycle 1 according to the clock signal 1 (the first clock signal), bit N−1 is generated in clock cycle 2 according to the clock signal 2 (the second clock signal), . . . , and bit 1 is generated in clock cycle N according to the clock signal N (the Nth clock signal). Table 2 above shows an example of the numbered clock cycles. In an example operation, when the SAR block 804 receives the clock signal 1 as an initial clock signal to start the A/D conversion in an ADC cycle, the SAR block 804 operates in the full mode and starts the conversion from determining bit N; and when the SAR block 804 receives the clock signal K as an initial clock signal to start the A/D conversion in an ADC cycle, the SAR block 804 operates in the partial mode and starts the conversion from determining bit K. FIG. 9 shows an example of utilizing clock signals to control operation of the SAR ADC in a determined mode. Those of ordinary skill in the art would recognize various embodiments, alterations and modification may be made to implement the control.

FIG. 9 is a block diagram of another example circuit 900 of a SAR ADC according to embodiments of the present disclosure. Specifically, FIG. 9 shows example circuits for implementing the SAR block 804 and the ADC_C block 810. For illustration purpose, the SAR block 804, the comparator 802, the DAC 806, the BTCC 808 and the ADC_C block 810 are re-numbered in FIG. 9.

The circuit 900 includes a SAR block 910, a BTCC 920, a DAC 930, a comparator 940 and a ADC controller 950, which operate similarly to the SAR block 804, the BTCC 808, the DAC 806, the comparator 802, and the ADC_C block 810, respectively.

The SAR block 910 includes data latch 912, a SAR logic block 914 and a register 916. During the present ADC cycle for converting a sampled value of an input analog voltage $V_{IN}$ to a N-bit digital value Dm (i≤m≤M), the data latch 912 receives, in each clock cycle according to the ADC_CLK (clock signal) during the conversion phase, a comparison result Vc (logic high or logic low) from the comparator 940, and passes the comparison result Vc to the SAR logic block 914. The SAR logic block 914 determines, based on the comparison result Vc, a value (0 or 1) of a present bit of the digital value Dm, and passes the value of the present bit to the register 916, which stores the value corresponding to the present bit. To determine $V_{DAC}$ for the next clock cycle (next bit), the register 916 sends a N-bit digital value DI (the presently determined digital value of $V_{IN}$) to BTCC 920, which converts the binary code DI to a thermometer code DT of P bits. The thermometer code DT is passed to the DAC 930, based on which the DAC 930 generates $V_{DAC}$ for the next clock cycle. The comparator 940 compares the newly generated $V_{DAC}$ and VCM to output a comparison result for the next clock cycle. The SAR block 910 then determines a value of the next bit based on the comparison result. This procedure continues until bit 1 of Dm is determined, i.e., Dm is determined, and Dm is then sent to the ADC controller 950 by the SAR block 910 from the register 916.

The ADC controller includes registers 952, 954, 958 and 960, a subtractor 956, and a clock signal generator 962. The digital value Dm generated in the present ADC cycle is sent to the register 952 and stored therein. The register 952 receives and stores all digital values D1~DM generated by the SAR block 910 for the input analog voltage, and outputs these digital values. The register 952 also sends Dm to the register 954.

The register 954 is configured to calculate and store an average Davg of all (e.g., D1–Dm–1) or some (e.g., D(m–J)~D(m–1)) digital values that has/have been generated in previous ADC cycle(s). Davg may be initialized with void and updated each time when a presently generated digital value Dm is received. For example, Davg may be updated with the presently generated digital value Dm as: Davg=(Davg+Dm)/2. In an embodiment, when Dm=D1 (m=1), i.e., only the first digital value for the input analog voltage is generated, Davg may be updated as Davg=D1. In this case, the ADC controller 950 may control the SAR block 910 to perform the full mode for the next ADC cycle (i.e., for generating the next digital value D2), skipping the operations with the registers 956 and 958. As an example, the ADC controller 950 may send Davg=void to the register 960, based on Davg, the register 960 may control the clock signal generator 962 to generate an initial clock signal indicating the full mode to be used in the next ADC cycle.

Based on Dm and Davg, the ADC controller 950 determines whether to select the full mode or the partial mode for the next ADC cycle, and controls the SAR block 910, the BTCC 920 and the DAC 930 to operate according to the selected mode in the next ADC cycle.

In some embodiments, subtraction may then be performed on Dm and Davg (before being updated with the presently generated digital value) at the subtractor 956 to obtain a difference Ddiff (N bits) between Dm and Davg. This is equivalent to comparing Dm and Davg to determine whether there is a sequence of MSBs (starting form bit N) in Dm and Davg having the same values and how many bits are included in the sequence of MSBs. The sequence of MSBs (starting form bit N) including L MSBs is referred to as "same L MSBs" for illustration convenience in the following description.

The subtraction may be performed as: Ddiff=Dm–Davg or Ddiff=Davg–Dm, and thus Ddiff may be a negative value. An absolute value of Ddiff may be obtained and used in the subsequent processing. In the following, when Ddiff is mentioned, it refers to the absolute value of Ddiff, unless otherwise provided. Ddiff obtained may be a value that can be represented as a Q-bit binary number, where Q is an integer and 0≤Q≤N. For example, Ddiff is 20, which can be represented using Q=5 bits. This indicates that 5 LSBs, starting from bit 1, of Dm and Davg have different values, and consequently, starting from bit N, Dm and Davg have same N–5 (i.e., L=N–5) MSBs. When Q=N, this indicates that Dm and Davg have no same consecutive MSBs starting from bit N. Ddiff is then passed to the register 958 and stored therein. In one embodiment, the register 958 may only store the maximum Ddiff (Ddiff-max) of the most recent R ADC cycles, where R is an integer and R<N. As an example, R may be set to be N/4, or N/6. Ddiff–max may be represented as Ddiff–max=max{Ddiffm, Ddiff(m–1), . . . , Ddiff(m–R+1)}.

The maximum Ddiff, i.e., Ddiff-max (or the number of bits Q of Ddiff-max) is sent to the register 960, based on which, the ADC controller 950 determines whether to select the full mode or the partial mode, and performs initial configuration for the selected mode. In some embodiments, the partial mode may be selected when Q<N–1, and the full mode may be selected when Q≥N–1. In some embodiments, the mode may be selected based on the mode resolution K (which is determined based on Q) as described in the following. Other rules may also be applicable for determining which mode is to be selected based on Ddiff-max (or Q).

When the partial mode is selected for the next ADC cycle in generating the digital value Dm+1, initial configuration may be performed for the partial mode. In some embodiments, the initial configuration may include configuring the mode resolution K for the partial mode, and configuring DI for the BTCC 920. Specifically, the mode resolution K is determined based on Q; and further, the ADC controller 950 determines the LSBs of the digital value Dm+1 that need to be determined by the SAR block 910, and consequently, the MSBs of the digital value Dm+1 that do not need to be determined by the SAR block 910, where values of these MSBs are obtained based on Davg (before updating) received from the register 954.

As an example, based on Ddiff-max (Q), the control block 950 determines that Dm and Davg have the same L MSBs, where L=N–Q. The mode resolution K may be set/defined as K=N–L+1=Q+1. Other ways (e.g., as described above) to set/define K may also be applicable. Then (N–K) MSBs of Dm+1 may be set with values of bit N to bit (K+1) of Davg(N:1), and K LSBs of Dm+1 will be determined by the SAR block 910. That is, Dm+1(N:1)=Davg(N:K+1)+Dm+1(K:1), where Dm+1(K:1) are determined by the SAR block 910. For the SAR block 910 to start A/D conversion in the next ADC cycle from determining bit K, DI in the BTCC 920 may be initialized with values of the Davg(N:K+1) for bit N to bit K+1, and bit K of DI is initialized with value 1. This initialization is represented by $D_{LSB}$ and $D_{MSB}$ In FIG. 9. $D_{MSB}$ (N:K+1)=Davg(N:K+1). $D_{LSB}$ has K bits with bit K initialized with 1, and bits K–1 to 1 initialized with 0. That is, $D_{LSB}$(K:1)={1, 0, . . . 0}, with K–1 "0s". $D_{LSB}$ and $D_{MSB}$ are then fed to the BTCC 920 as an initial data for generating $V_{DAC}$, which is used for determining bit K of Dm+1 by the SAR block 910.

In some embodiments, K may be determined at the register 960 based on Q. When 1≤K<N, the ADC controller selects the partial mode for the next ADC cycle. $D_{LSB}$ and $D_{MSB}$ may be initialized as discussed above. When K≥N, which indicates that Dm and Davg do not have a sequence of MSBs having the same bit values, the ADC controller selects the full mode for the next ADC cycle. In this case, $D_{MSB}$ may be set as void, and $D_{MSB}$ may be set to have N bits, with bit N initialized with value 1.

In addition to the initial configuration performed, the ADC controller 950 also generate control signals indicating, to the SAR block 910, which mode is selected for the next ADC cycle. In some embodiments, as shown in FIG. 9, the register 960 may send bit information about $D_{LSB}$ and/or $D_{MSB}$ to the clock generator 962, e.g., K, as a control signal to control the clock generator 962 to generate an initial clock signal ADC_CLK to start the next ADC cycle in generating Dm+1. Based on the initial clock signal, the SAR block 910 understands whether it is operating the full mode or the partial mode, and if the partial mode is used, which bit (K) is the initial bit to be determined.

In an example where clock signals are used for controlling the operation of the selected mode as discussed above, the register 960 may send the number K to the clock generator 962, based on which, the clock generator 962 generates a clock signal of number (N-K+1) as an initial clock signal for the next ADC cycle, indicating that the A/D conversion for Dm+1 in the next ADC cycle starts from determining bit K in the partial mode. the SAR block 910 determines bit K of Dm+1, and then continues to determine bits K−1, K−2, . . . , 1.

When K≥N, i.e., (N-K+1)≤1, the clock generator 962 generates a clock signal 1 as an initial clock signal for the next ADC cycle, indicating that the A/D conversion in the next ADC cycle for Dm+1 starts from determining bit N. That is, the SAR ADC operates in the full mode in the next ADC cycle.

The clock generator 962 may generate clock signals based on the bit information received from the register 960 and a pre-scaled clock signal PCLK from an MCU or a chip logic control unit. The clock generator 962 may also send a control signal SH to the DAC 930 instructing sampling of the input analog voltage before the initial clock signal for A/D conversion is sent. $V_{DAC}$ is generated based on thermometer code DT and the sampled value of the input analog voltage.

It is noted that the circuits in FIG. 8 and FIG. 9 are merely examples provided for implementing the embodiments methods of the present disclosure. One or more components in these circuits may be changed, removed, or enhanced, and new component(s) may be added. As an example, the subtractor 956 may be removed and a comparator may be used instead, in which case, additional components may be added to determine L and K. As another example, the register 958 may be removed. Other circuits with different structures and components may also be applicable for implementing the embodiments methods of the present disclosure.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A method comprising:
generating, by use of a successive approximation register (SAR) analog-to-digital converter (ADC), a first digital data of N-bit and a second digital data of N-bit for an analog data, wherein N is an integer greater than 1, and the analog data is a sampled data; and
determining that the second digital data and the first digital data generated for the sampled data include a first sequence of most significant bits (MSBs) having same values, and based thereon, generating a third digital data of N-bit for the sampled data using the SAR ADC in a partial mode, in which the SAR ADC is configured to skip determining value(s) of a second sequence of MSBs of the third digital data.

2. The method of claim 1, wherein generating the third digital data of N-bit in the partial mode comprises:
setting value(s) of the second sequence of MSBs of the third digital data with respective value(s) of the second sequence of MSBs of the second digital data; and
determining, using the SAR ADC, values of remaining bits of the third digital data.

3. The method of claim 2, wherein the second sequence of MSBs comprises less number of bits than the first sequence of MSBs.

4. The method of claim 1, further comprising:
when the second digital data and the first digital data include the first sequence of MSBs having the same values, determining, based on whether a condition is satisfied, to generate the third digital data of N-bit for the analog data in the partial mode.

5. The method of claim 4, wherein the condition is satisfied when a number of bits L of the first sequence of MSBs is greater than a threshold number W, L and W being integers between 1 and N.

6. The method of claim 5, wherein the threshold number W is based on N.

7. The method of claim 5, wherein the condition is satisfied when a pre-set number of digital data for the analog data have been generated.

8. The method of claim 1, further comprising:
when determining that the first digital data, the second digital data or the third digital data is invalid, regenerating the first digital data, the second digital data or the third digital data using the SAR ADC in a full mode, the full mode comprising determining every bit of a re-generated N-bit digital data using the SAR ADC.

9. The method of claim 1, wherein the first digital data or the second digital data is generated using the SAR ADC in the partial mode or in a full mode, the full mode comprising determining every bit of a digital data using the SAR ADC.

10. The method of claim 1, further comprising:
determining a number of bits in the second sequence of MSBs based on N, a number of bits in the first sequence of MSBs, or a combination thereof.

11. The method of claim 1, further comprising:
when determining that the second digital data and the first digital data do not include the first sequence of MSBs having the same values, generating the third digital data of N-bit for the analog data using the SAR ADC in a full mode, the full mode comprising determining every bit of the third digital data using the SAR ADC.

12. The method of claim 1, wherein the first digital data is an average of a plurality of digital data converted for the analog data.

13. The method of claim 1, further comprising:

generating a clock signal indicating the partial mode.

14. A method comprising:

generating, by use of a successive approximation register (SAR) analog-to-digital converter (ADC), a first digital data and a second digital data for an analog data, the first digital data and the second digital data each having N bits;

determining whether the second digital data includes a first sequence of bits having same values as the first sequence of bits of the first digital data, the first sequence of bits starting from a first most significant bit (MSB);

when the second digital data includes the first sequence of bits having the same values as the first sequence of bits of the first digital data, determining, based on whether a condition is satisfied, whether to generate a third digital data of N bits for the analog data using the SAR ADC in a partial mode; and when the condition is satisfied, generating the third digital data in the partial mode, the generating comprising:

setting value(s) of a second sequence of bits of the third digital data with respective value(s) of the second sequence of bits of the second digital data, the second sequence of bits starting from the first MSB, and the second sequence of bits comprising less than N bits; and determining values of remaining bits of the third digital data using the SAR ADC.

15. The method of claim 14, wherein the second sequence of bits comprises less bits than the first sequence of bits.

16. The method of claim 14, wherein the condition is satisfied when a number L of the first sequence of bits is greater than a threshold number, L and the threshold number being integers between 1 and N.

17. The method of claim 16, wherein the condition is satisfied when a pre-set number of digital data for the analog data have been generated.

18. The method of claim 14, further comprising:

determining whether the third digital data is a valid digital data; and when the third digital data is invalid, switching to a full mode from the partial mode to re-generate the third digital data of N bits in the full mode, the full mode comprising determining every bit of the third digital data using the SAR ADC.

19. The method of claim 14, wherein the first digital data or the second digital data is generated using the SAR ADC in the partial mode or in a full mode, the full mode comprising determining every bit of a digital data using the SAR ADC.

20. The method of claim 14, further comprising:

when the second digital data does not include the first sequence of bits having the same values as the first sequence of bits of the first digital data, generating the third digital data of N bits for the analog data using the SAR ADC in a full mode, the full mode comprising determining every bit of the third digital data using the SAR ADC.

* * * * *